(12) United States Patent
Friesen et al.

(10) Patent No.: US 11,899,046 B2
(45) Date of Patent: Feb. 13, 2024

(54) MEASURING APPARATUS FOR OPERATING STATE

(71) Applicant: HARTING ELECTRIC GMBH & CO. KG, Espelkamp (DE)

(72) Inventors: Markus Friesen, Espelkamp (DE); Felix Loske, Minden (DE)

(73) Assignee: HARTING ELECTRIC GMBH & CO. KG

( * ) Notice: Subject to any disclaimer, the term of this patent is extended or adjusted under 35 U.S.C. 154(b) by 350 days.

(21) Appl. No.: 17/279,526

(22) PCT Filed: Nov. 25, 2019

(86) PCT No.: PCT/DE2019/101007
§ 371 (c)(1),
(2) Date: Mar. 24, 2021

(87) PCT Pub. No.: WO2020/108698
PCT Pub. Date: Jun. 4, 2020

(65) Prior Publication Data
US 2021/0341518 A1 Nov. 4, 2021

(30) Foreign Application Priority Data
Nov. 30, 2018 (DE) ............ 10 2018 130 509.5

(51) Int. Cl.
*G01R 15/20* (2006.01)
*G01R 19/00* (2006.01)
(Continued)

(52) U.S. Cl.
CPC ....... *G01R 15/202* (2013.01); *G01R 19/0092* (2013.01); *G08C 17/02* (2013.01);
(Continued)

(58) Field of Classification Search
CPC ............ G01R 15/202; G01R 19/0092; G08C 17/02; H01M 10/425; H01M 2010/4271;
(Continued)

(56) References Cited

U.S. PATENT DOCUMENTS

| 9,383,233 B2 | 7/2016 | Peters et al. ............. H05K 7/02 |
| 2009/0081902 A1 | 3/2009 | Montena et al. ......... H01R 9/05 |

(Continued)

FOREIGN PATENT DOCUMENTS

| CN | 104931082 | 9/2015 | ............. G01D 11/00 |
| DE | 20 2007 018 306 | 6/2008 | ............. H01R 13/66 |

(Continued)

OTHER PUBLICATIONS

German Search Report issued in German Patent Appln. No. 10 2018 130 509.5, dated Sep. 11, 2019, with machine English translation, 16 pages.

(Continued)

*Primary Examiner* — Alvaro E Fortich
(74) *Attorney, Agent, or Firm* — HAYES SOLOWAY P.C.

(57) ABSTRACT

A hardware- and software-supported measuring apparatus for monitoring the operating state of a device has at least one sensor for capturing measurement data of at least one physical parameter that characterizes the operating state of the device, autonomous electronics including a control unit an energy source and a microcontroller, which provides a radio interface for data transmission and/or signal transmission to a control and/or evaluation apparatus, and a housing, which is fastened to the device in a retrofittable manner. The apparatus has at least one sensor and a control and/or evaluation apparatus, which is wirelessly connected to the measuring apparatus for signal transmission and/or data transmission.

19 Claims, 4 Drawing Sheets

(51) Int. Cl.
  *G08C 17/02* (2006.01)
  *H01M 10/42* (2006.01)
  *H04Q 9/00* (2006.01)
  *H01R 12/73* (2011.01)

(52) U.S. Cl.
  CPC .......... *H01M 10/425* (2013.01); *H04Q 9/00* (2013.01); *H01M 2010/4271* (2013.01); *H01R 12/737* (2013.01); *H01R 2201/20* (2013.01); *H04Q 2209/40* (2013.01)

(58) Field of Classification Search
  CPC .......... H01M 50/216; H04Q 9/00; H04Q 2209/40; H01R 12/737; H01R 2201/20; H01R 13/62966; H01R 13/6675; H01R 13/6683; H01R 13/6691; Y02E 60/10; G01D 21/02
  See application file for complete search history.

(56) References Cited

U.S. PATENT DOCUMENTS

| | | | | |
|---|---|---|---|---|
| 2010/0178806 A1* | 7/2010 | Montena | ................ | H01R 24/42 439/620.03 |
| 2012/0031984 A1* | 2/2012 | Feldmeier | ................ | F24F 11/65 236/49.3 |
| 2012/0209165 A1* | 8/2012 | Degen | ................... | G16H 40/63 604/9 |
| 2013/0045616 A1* | 2/2013 | Adams | ................ | G02B 6/3893 439/304 |
| 2015/0268069 A1 | 9/2015 | Peters et al. | ........... | G01D 11/24 |
| 2016/0297315 A1 | 10/2016 | Gonzalez et al. | ...... | B60L 11/18 |
| 2018/0086213 A1 | 3/2018 | Jefferies et al. | ...... | B60L 11/182 |

FOREIGN PATENT DOCUMENTS

| | | | | |
|---|---|---|---|---|
| DE | 20 2007 018 307 | | 7/2008 | ............ H01R 13/66 |
| DE | 20 2009 001 447 | | 7/2009 | ............ G08C 17/02 |
| DE | 10 2011 075 807 | | 11/2012 | ............ G01B 7/16 |
| EP | 2522465 | | 11/2012 | ............ B25B 29/02 |
| WO | WO 2015/099777 | | 7/2015 | ............ G06Q 20/18 |

OTHER PUBLICATIONS

International Search Report (w/ English translation) and Written Opinion issued in PCT/DE2019/101007, dated Feb. 27, 2020, 13 pages.
Chinese Official Action issued in related Chinese Patent Application Serial No. 201980078358.7, dated Jan. 20, 2023, 37 pages with machine translation.
International Preliminary Report on Patentability issued in PCT/DE2019/101007, dated May 25, 2021, 7 pages.

* cited by examiner

MEASURING APPARATUS FOR OPERATING STATE

The invention relates to a measuring apparatus for monitoring the operating state of a device to be monitored. The invention also relates to a method for monitoring the operating state of a device and to a system suitable for said method.

A device to be monitored can be, for example, a machine and/or a control cabinet and/or a plug-in connector and/or a larger installation unit of a multiplicity of, for example, plug-in connectors.

Plug-in connectors are needed to make connections for signal and/or energy transmission, including for the operation of essential equipment such as supply equipment, for example. Connections of electrical, pneumatic or optical signals, for example, are also sensitive in particular to environmental influences. It is therefore desirable to monitor the operating state of the connections of a plug-in connector and/or of a control cabinet having a multiplicity of plug-in connectors, and also of larger installation units having a multiplicity of plug-in connectors, in particular of essential equipment.

PRIOR ART

DE 20 2007 018 306 U1 discloses a measuring apparatus for measuring a multiplicity of physical measurement parameters for a plug-in connection of a modular plug-in connector. The measuring apparatus is provided in a first module housing of the plug-in connector. For the purpose of signal transmission and supplying power for the measuring apparatus, a contact unit is provided in a second, adjacent module housing, which forwards the signals to a monitoring apparatus by means of electrical conductors.

The known measuring apparatus requires two module housings for a plug-in connector, thereby disadvantageously limiting the possible assignment or configuration of the plug-in connector and hence also its potential use. The potential uses of the measuring apparatus are consequently also restricted to plug-in connectors having two empty adjacent module slots. For this reason, retrofitting the known measuring apparatus is also only possible in a disadvantageously complicated and accordingly costly manner. This is also the case especially since the measuring apparatus requires for its power supply and signal transmission a wired and correspondingly complicated installation.

The German Patent and Trade Mark Office has searched the following prior art in the priority application relating to the present application: DE 10 2011 075 807 A1, DE 20 2007 018 306 U1 and DE 20 2009 001 447 U1.

Statement of the Problem

The object of the invention is to provide a measuring apparatus for monitoring the operating state of a device, and to define a method for monitoring the operating state of a device, which method is also suitable in particular for monitoring larger installation units. A further object is to provide a system suitable for said method. It is a particular object of the invention to provide a measuring apparatus for monitoring the operating state of the connections of a plug-in connector.

The object is achieved by the features of the independent claims.

Advantageous embodiments of the invention appear in the dependent claims and/or the following description.

The present invention relates in particular to a hardware- and software-based measuring apparatus for monitoring the operating state of a device, which in particular can be a machine and/or a control cabinet and/or a plug-in connector and/or a larger installation unit of a multiplicity of, for example, plug-in connectors.

The measuring apparatus comprises at least one sensor for capturing measurement data relating to at least one physical parameter that characterizes the operating state of the device.

The measuring apparatus particularly advantageously comprises autonomous electronics having a control unit and a means for supplying power, which means may appropriately be a battery, a supercapacitor or a hybrid battery. Thus the measuring apparatus in particular does not need any additional cables even for its power supply.

The measuring apparatus also comprises advantageously a control unit having a microcontroller that provides a radio interface for data and/or signal transmission to a first control and/or analysis apparatus, whereby the measuring apparatus also does not need any additional cables for its data and/or signal transmission.

The measuring apparatus is therefore easy to install and can be retrofitted easily and economically without associated installation expense even in devices and/or installation equipment already in operation.

The measuring apparatus comprises appropriately for this purpose a housing having suitable means for fastening the measuring apparatus on the device.

According to an advantageous embodiment, it can be particularly advantageous for the housing to be a blanking plug intended for the device, in which blanking plug at least part of the measuring apparatus is accommodated. A measuring apparatus arranged in a blanking plug can be installed, even retrofitted, particularly easily and economically. In addition, in existing installations, it is easy to replace blanking plugs that are already present without intervening in the operation of a device, which may be a machine and, particularly advantageously, may be a plug-in connector. The blanking plug may be a first housing, in which the measuring apparatus is accommodated. The blanking plug may also be a second housing of a measuring apparatus accommodated in a first housing, wherein at least part of the first housing is arranged in the blanking plug.

A blanking plug suitable for an aforesaid measuring apparatus may be, for example, a blanking plug intended for a module of a modular plug-in connector.

A blanking plug suitable for the measuring apparatus can be, particularly advantageously, a blanking plug intended for an unused cable feedthrough through a machine housing or a plug-in connector housing. A suitable blanking plug of this type is described below in detail with reference to the drawings.

The above-mentioned radio interface can appropriately have a communications protocol having a power consumption of less than 1 W and preferably of less than 0.5 watts (W) and more preferably of less than 0.1 W, and a peak current consumption of less than 30 milliamperes (mA) and preferably of less than 15 mA. BLE (Bluetooth low energy) is such a communications protocol that is particularly preferred for the aforesaid measuring apparatus.

Communications protocols having an aforesaid power consumption, and in particular BLE, allow data to be transferred efficiently while conserving energy reserves by facilitating long sleep times and by addressing energy-intensive components such as the radio interface as infrequently as possible. Such communications protocols, and in particular BLE, allow reliable and robust signal and/or data transmission to a control and/or analysis apparatus over a distance of at least 10 m, and hence are also suitable for larger installation units.

The control unit for data and/or signal transmission can appropriately comprise a chip antenna, whereby the measuring apparatus has a particularly compact design and occupies only a small amount of space. An aforesaid measuring apparatus having such a control unit can be provided in an advantageously compact three-dimensional shape, which is defined mainly by the dimensions of the means for supplying power to the measuring apparatus, which means may be a battery, and/or of a blanking plug intended for the measuring apparatus and/or of a space available inside a housing of a device to be monitored and in particular inside a plug-in connector housing, and/or inside a cable feed-through.

In addition, for the purpose of data and/or signal transmission, the control unit can be connected to an external antenna that extends outwards out of the housing of the device, thereby boosting the range of the radio interface, even in cluttered larger installations.

The control unit can be equipped appropriately with a bus interface, by means of which the sensor is connected to the control unit. In this case, the sensor can be located advantageously on a sensor unit, wherein the control unit can be fitted with the sensor unit and can address the sensor unit via the bus interface.

For a measuring apparatus of compact three-dimensional shape, the electronics of the control unit and the electronics of the sensor unit can be provided jointly on a first printed circuit board, which is advantageous also for a measuring apparatus that is easy to install and provided externally on a housing of a device to be monitored.

In addition, the electronics of the control unit can be provided on a first printed circuit board and comprise a first connecting terminal, and the electronics of the sensor unit can be provided on a second printed circuit board and comprise a second connecting terminal, which corresponds to the first connecting terminal such that the control unit can be fitted with the sensor unit.

It is thereby advantageously possible to provide a multiplicity of different sensor units having sensors and/or three-dimensional shapes that are optimized for predetermined uses. The three-dimensional shape of the sensor unit can be designed here such that the sensor is spaced from the control unit and advantageously is located inside the housing of the device to be monitored, and even in the vicinity of a position of interest to be monitored.

The sensor can hence be located particularly advantageously inside the housing of a plug-in connector to be monitored and close to at least one connection provided by the plug-in connector.

The sensor unit can be appropriately spaced from the control unit by means of a suitable adapter cable provided between the first and second connecting terminals. This advantageously allows the sensor to be positioned in the immediate vicinity of a region under observation, which in particular may be a contact region of a plug-in connection, thereby facilitating particularly sensitive monitoring of predetermined physical parameters to be monitored.

In particular, a plug-in connection of this type under observation may be an electrical plug-in connection. For example, a Hall sensor arranged in the vicinity of connected electrical contacts can measure a current particularly reliably.

In addition to the aforesaid radio interface and bus interface, the control unit can also appropriately comprise an apparatus for data-storage and/or analysis.

In addition, the control unit and the sensor unit can be designed and configured appropriately such that the measuring apparatus has an average power consumption of less than 100 microamperes ($\mu$A) and preferably of less than 50 $\mu$A. A battery provided by a button cell having a capacity of at least 70 milliampere hours (mAh) and preferably of at least 180 mAh and a rated voltage of 2.5 volts (V) to 4.5V can advantageously be used for supplying power to such a measuring apparatus.

An aforesaid battery is constructed in the advantageously compact form of a flat cylinder and, given the aforesaid suitable power consumption of the electronics of the measuring apparatus, allows a desirable running time of up to three years.

The first printed circuit board of the control unit can also comprise appropriately a battery holder for accommodating the battery and also, for a desirably compact three-dimensional shape, can advantageously have a circular design of dimensions defined essentially by the dimensions of the battery. The first connecting terminal of the control unit can be provided appropriately on the first printed circuit board in such a way, and a sensor unit located on a second printed circuit board can also be designed in such a way, that the sensor unit does not protrude radially laterally over the control unit, and the sensor of the sensor unit is axially spaced from the control unit in a desirable manner.

An aforesaid measuring apparatus moreover can comprise appropriately at least one actuator for indicating a predetermined detected/sensed operating state and/or for performing an action in response to a predetermined operating state. For example, and advantageously, such an actuator may be an LED for optically indicating a predetermined operating state, where the indicator may indicate a fault-free and/or faulty and/or critical operating state of the device and/or of the measuring apparatus. An actuator in the form of an LED can also be located on a housing of a device to be monitored, and in particular on an above-described blanking plug, such that it is visible from outside.

A critical operating state of the device may be, for example, a raised operating temperature, and a critical operating state of the measuring apparatus may be, for example, a low capacity of the power supply means, for instance a low battery charge.

The facility to identify and/or locate a device in a critical operating state and/or requiring servicing, for example, can hence be provided in a simple way.

In addition, an aforesaid actuator may be an acoustic or mechanical actuator, for example, where a mechanical actuator can be suitably configured and designed to interrupt the operation of a plug-in connector connection.

An aforesaid measuring apparatus can comprise a sensor which is suitable for numerous uses and which detects a physical parameter that is suitable for detecting an operating state of a device to be monitored, and in particular the state characterizing connections of a plug-in connector. Such a sensor may be a sensor for detecting the current carried via contacts of an electrical connection, and/or a sensor for detecting the prevailing temperature here and/or a humidity sensor and/or an accelerometer and/or a Hall sensor and/or a magnet sensor and/or a light sensor. An aforesaid measuring apparatus can also comprise a multiplicity of the aforesaid sensors.

A suitable housing for a measuring apparatus according to the invention, and in particular a suitable blanking plug, is provided at least in part from an electrically non-conducting material so as to ensure reliable signal and/or data transmission by means of the radio interface of the control unit of the measuring apparatus.

A particularly suitable blanking plug for an aforesaid measuring apparatus can be provided and accordingly embodied in particular by a blanking plug intended for a cable feedthrough of a cable gland through the housing of a device to be monitored, and in particular through the housing of a plug-in connector. Such blanking plugs can be retrofitted particularly easily even in installations that are already in operation.

The present invention also relates in particular to a hardware- and software-based method for monitoring the operating state of a device, which can be a machine and/or a control cabinet and/or a plug-in connector and/or a larger installation unit, using at least one measuring apparatus having at least one sensor for capturing measurement data relating to at least one physical parameter that characterizes the operating state of the device. The measuring apparatus used has an electronic control unit having a microcontroller that comprises a radio interface.

A first hardware- and software-based control and/or analysis unit, which is wirelessly connected to the measuring apparatus for the purpose of signal and/or data transmission, is also used in the aforesaid method.

The measuring apparatus captures measurement data relating to at least one physical parameter that characterizes the operating state of the device, and performs at least one of the following steps relating to the analysis and/or collection and/or transmission of the measurement data captured by the measuring apparatus.

It can be desirable for selected uses that the measuring apparatus analyzes at least partially the measurement data captured by the measuring apparatus. This can be advantageous in particular for smaller installation units of only a few devices to be monitored that have a correspondingly small number of measuring apparatuses.

For example, when monitoring just one device, the power consumption of the measuring apparatus can advantageously be minimized by the measuring apparatus also already performing a full analysis of the captured measurement data, especially since in this case a small-scale implementation of the data transmission to the first control and/or analysis apparatus is possible. The aforesaid advantageous small-scale implementation of the data transmission can relate to the cycle rate thereof and/or the amount of transmitted data and/or signals.

In the case of a full analysis of the captured measurement data by the measuring apparatus, it is also possible to transmit to the first control and/or analysis apparatus just one signal characterizing the analysis.

For further selected uses, it can be desirable to transmit the measurement data captured by the measuring apparatus to the first control and/or analysis apparatus in particular also collectively, in which case it is also appropriate that the first control and/or analysis apparatus can retrieve in a predetermined cyclical manner the measurement data captured by the measuring apparatus. This can be advantageous in particular for larger installation units comprising a multiplicity of monitored devices that have a correspondingly high number of measuring apparatuses and/or for smaller, highly sensitive installation units.

It can also be appropriate for the first control and/or analysis apparatus to collect and/or at least partially analyze the measurement data captured by the measuring apparatus.

The collection and/or analysis of the measurement data at a central point, namely at the first control and/or analysis apparatus, allows an extensive and also more comprehensive analysis of the measurement data, for instance also a statistical analysis.

Furthermore, the first control and/or analysis apparatus can be networked for signal and/or data communication, as described below, to a further, second control and/or analysis apparatus, so that the analyzed measurement data and/or a signal from an already performed analysis can be transmitted to a predetermined suitable apparatus and/or position and be available there for further analysis. As described below, this facilitates advantageous servicing, in which operating states identified as faulty are identified promptly and can be rectified, for example, by replacing faulty devices.

The second control and/or analysis apparatus can also be appropriately networked for signal and/or data communication to a multiplicity of first control and/or analysis apparatus.

As stated above, the measurement data can be analyzed by the measuring apparatus and/or by the first control and/or analysis apparatus in such a way that, for instance, a faulty or even desirable operating state of the monitored device is ascertained.

The measurement data can be analyzed in such a way that a signal corresponding to the analysis result is made from the measuring apparatus to an actuator, which can be provided on the control unit of the measuring apparatus and/or on a device to be monitored, wherein in the case of the measurement data being analyzed by the first control and/or analysis apparatus, a suitable signal can be made to the measuring apparatus. A suitable actuator can be, for example, an optical indicator, whereby, for example, an LED can indicate an identified operating state of a device to be monitored, which operating state corresponds to the analysis result.

It is obvious that, in particular for larger installation units, in addition to the measurement data, also further data, for instance identification data of the measuring apparatus and/or of a device to be monitored, can be retrieved and/or transmitted from the measuring apparatus to the first control and/or analysis apparatus. The identification data can also be used for targeted communication between the first control and/or analysis apparatus and a selected measuring apparatus. For measuring apparatuses that have autonomous electronics powered, for example, and advantageously, by means of a battery, the aforesaid data and/or signals transmitted to the first control and/or analysis apparatus can also appropriately contain data about the battery status of the measuring apparatus.

In the method according to the invention, the capture and/or collection and/or analysis and/or retrieval and/or transmission of the measurement data and/or signals by the control unit of the measuring apparatus and/or by the first control and/or analysis unit can be appropriately performed such that the measuring apparatus has an average power consumption of less than 100 µA and preferably of less than 50 µA.

The aforesaid operation of the measuring apparatus is particularly energy efficient and is advantageous, in particular, for measuring apparatuses having autonomous electronics powered by means of a battery, whereby such a measuring apparatus has a desirably long operating life.

Depending on the use, the aforesaid capture and/or collection and/or analysis and/or retrieval and/or transmission of the measurement data and/or signals can be performed thereby in a manner optimized for the particular use at a cycle rate preselected in each case. For example, for measuring apparatuses having an active sensor in an installation unit of higher sensitivity and/or priority, it can be advantageous for said sensor to be activated to perform a measurement at a correspondingly higher cycle rate.

As mentioned above, it can also be appropriate to use in the method according to the invention at least one second hardware- and software-based control and/or analysis apparatus, which is connected by wired and/or wireless means to the first control and/or analysis apparatus for signal and/or data transmission.

The data collected and/or analyzed by the first control and/or analysis apparatus, and/or a signal corresponding to the analyzed data, can be transmitted in this case to the second control and/or analysis apparatus and/or retrieved by the second control and/or analysis apparatus, wherein the data and/or the signal is collected and/or analyzed appropriately by the second control and/or analysis apparatus.

Using a second control and/or analysis apparatus is advantageous in particular when a measuring apparatus according to the invention, as described in the introduction, is used that has a radio interface and a communications protocol that has a low power consumption and correspondingly limited range.

The second control and/or analysis apparatus may appropriately be, in particular, a host computer and/or a server, which is networked by wired and/or wireless means to the first control and/or analysis apparatus via a local or global area network for signal and/or data transmission.

In addition, the second control and/or analysis apparatus can be a cellphone, in particular of a service engineer.

In addition to further analyses, for instance including statistical analyses, and/or protocol updates, the measurement data and/or the signal can appropriately also be analyzed by the second control and/or analysis apparatus in such a way that a signal corresponding to the analysis result is made to the first control and/or analysis apparatus and/or a cellphone of a service engineer. As mentioned above, this facilitates desirably prompt servicing of a device to be monitored which in particular is in a critical operating state.

The first control and/or analysis apparatus can thereupon analyze the signal received from the second control and/or analysis apparatus in such a way that a signal corresponding to the analysis result is made to the measuring apparatus and/or a rate of a retrieval cycle of the measuring apparatus is configured in accordance with the analysis result.

The above-described method according to the invention can thereby be applied to different installation units in a manner optimally adapted thereto, in particular also taking into account the power consumption of said installation units. As stated above, the method also makes it possible to service said installation units in a desirably prompt manner.

The present invention also relates in particular to a system for monitoring the operating state of a device to be monitored, and in particular for monitoring the operating state of the connections of at least one plug-in connector, which system is suitable for performing an above-described method according to the invention.

An aforesaid system comprises at least one measuring apparatus having at least one sensor for capturing measurement data relating to at least one physical parameter that characterizes the operating state of the device to be monitored and in particular of at least one connection provided by a plug-in connector. The measuring apparatus has a control unit having a microcontroller that comprises a radio interface.

An aforesaid system also comprises at least one first hardware- and software-based control and/or analysis apparatus, wherein the measuring apparatus and the first control and/or analysis apparatus are configured for wireless bidirectional signal and/or data transfer.

The advantages described above for a method according to the invention, for instance advantages such as its many different potential uses for installation units in different applications, and facilitating prompt servicing, apply equally to a system according to the invention.

An aforesaid system can appropriately comprise in particular at least one measuring apparatus according to the invention, as described in the introduction, having autonomous electronics and a means for supplying power, which means may be a battery, a supercapacitor or a hybrid battery, and, as described above, advantageously can be installed easily and economically. Regarding the further advantages that this brings, reference is made here to the above description of the measuring apparatus according to the invention.

In addition, an aforesaid system can comprise particularly advantageously at least one second hardware- and software-based control and/or analysis apparatus, wherein the first control and/or analysis apparatus and the second control and/or analysis apparatus are configured for bidirectional signal and/or data transfer.

As stated above with regard to the method according to the invention, the second control and/or analysis apparatus may appropriately be in particular a host computer and/or a server and/or a cellphone, which are networked by wired and/or wireless means to the first control and/or analysis apparatus via a local or global area network for signal and/or data transmission.

EXEMPLARY EMBODIMENTS

Exemplary embodiments of the invention are described in more detail below and are shown in the drawings, in which.

Some of the Figures contain simplified schematic diagrams. The same reference signs are sometimes used for the same but possibly not identical elements. Different views of the same elements might be to different scales.

Figure 1A:
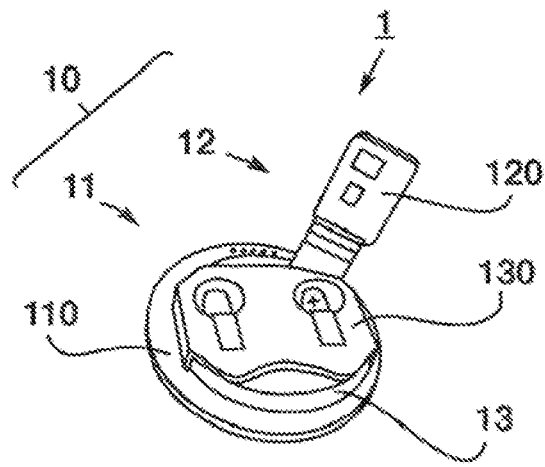
FIG. 1A shows a measuring apparatus according to an embodiment of the invention.
Figure 1B:
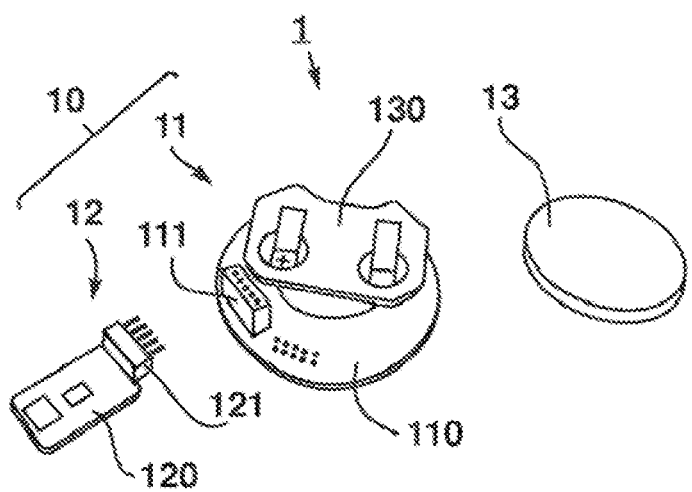
FIG. 1B shows the measuring apparatus from FIG. 1A disassembled into its essential constituent parts.

FIG. 1A shows a measuring apparatus 1 according to a particularly advantageous embodiment of the invention, and FIG. 1B shows a measuring apparatus 1 from FIG. 1A disassembled into its essential constituent parts. The measuring apparatus 1 from FIGS. 1A and 1B is particularly suitable for monitoring a device 3 that is designed such that it permits at least part of the measuring apparatus 1 to be located inside its housing 30, which device 3 may be, in particular, a plug-in connector 3.

The measuring apparatus 1 comprises autonomous electronics 10 having a control unit 11 and a battery 13 as a means for supplying power. The battery 13 is appropriately embodied as a button cell which has a capacity of at least 70 mAh and preferably of at least 180 mAh and a rated voltage of 2.5V to 4.5V, and advantageously has a flat-cylinder design.

The battery 13 is provided in a battery holder on a first printed circuit board 110 of the control unit 11, wherein the three-dimensional shape of the first printed circuit board 110 is appropriately circular in design in accordance with the dimensions of the battery 13. Consequently, the control unit advantageously has a compact design.

The electronics 10 of the control unit 11 comprise, in addition to the battery holder, a microcontroller arranged on the printed circuit board 110, which microcontroller provides a suitable radio interface for data and/or signal transmission to a first control and/or analysis apparatus, which is not shown in the drawing.

The electronics 10 of the control unit 11 also comprise a bus interface and, formed on the first printed circuit board 110, a first connecting terminal 111, which corresponds to a second connecting terminal 121 of a second printed circuit board 120 of a sensor unit 12 such that the printed circuit board 110 of the control unit 11 can be fitted with the sensor unit 12.

The second printed circuit board 120 of the sensor unit 12 comprises the second connecting terminal 121, which corresponds to the connecting terminal 111 of the first printed circuit board 110, and comprises at least one sensor suitable for detecting a physical parameter that can characterize the operating state of at least one connection of a plug-in connector 3.

The sensor unit 12, which is fitted onto the printed circuit board 110 of the control unit 11 by means of the first connecting terminal 111 and the second connecting terminal 121, extends substantially perpendicularly from the printed circuit board 110 such that the sensor arranged on the sensor unit 12 is spaced from the control unit 11.

The sensor unit 12 is also designed and arranged such that it does not protrude radially laterally beyond the circumferential edge of the circular printed circuit board 110. The measuring apparatus 1 comprising the sensor unit 12 and the control unit 11 thereby is designed to be particularly compact radially, and in particular is suitable for being accommodated at least in part in a blanking plug 2, which is described below with reference to FIGS. 1C and 1D. The blanking plug 2 here forms a housing 2 of the measuring apparatus 1. It is also desirable in this case that the sensor located on the sensor unit 12 is axially spaced from the control unit 11.

Figure 1C:
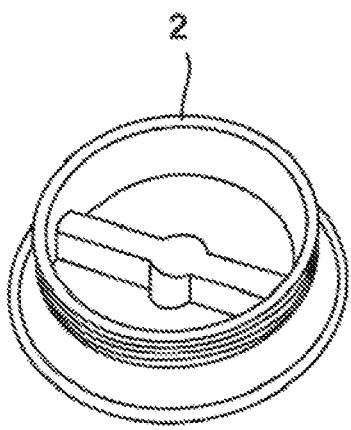
FIG. 1C shows the interior of a blanking plug according to an embodiment of the invention.

FIG. 1C shows the interior of an aforementioned blanking plug 2 according to an embodiment of the invention, which in particular is suitable for a cable feedthrough 31 through the housing 30 of a plug-in connector 3. Examples of a plug-in connector 3 having such a cable feedthrough 31 are described below with reference to FIGS. 3A, 3B and 3C.

The blanking plug 2 is essentially embodied as a hollow cylinder having an external thread which corresponds to an internal thread of a cable feedthrough 31 such that the blanking plug 2 is suitable for screwing into a cable feedthrough 31 in such a way that the blanking plug 2 tightly seals a housing 30 of a plug-in connector 3.

The cylindrical blanking plug 2 has on one face of its cylinder a head that protrudes radially laterally slightly beyond the cylinder so that once a blanking plug 2 is screw-fitted to a cable feedthrough 31, the head is located externally adjacent to the housing 30.

The blanking plug 2 is provided at least in part from an electrically non-conducting material so that the blanking plug 2 is suitable for ensuring that the radio interface of the control unit 11 of the measuring apparatus 1 works.

Figure 1D:
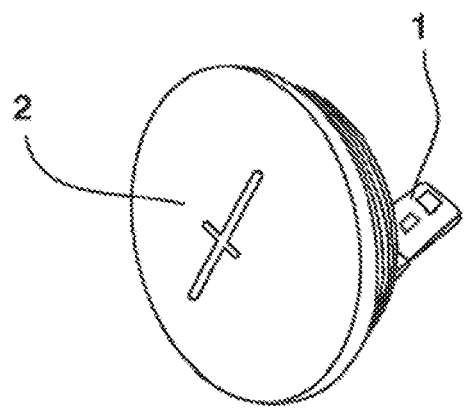
FIG. 1D shows the measuring apparatus from FIG. 1A in the blanking plug from FIG. 1C.

FIG. 1D shows the measuring apparatus 1 from FIG. 1A arranged in the blanking plug 2 from FIG. 1C, where the circular printed circuit board 110 of the control unit 11 is located in the cylindrical blanking plug 2 and, for instance, can be adhesively bonded to the blanking plug 2. The sensor unit 12 in this case protrudes advantageously out of the hollow cylinder of the blanking plug 2 and is partially visible in FIG. 1D, whereas the control unit 11 of the measuring apparatus is concealed in the drawing in particular by the head of the blanking plug 2.

In the case of a sensor according to FIG. 1A-D, a sensor unit 12 may be both inside (as shown) and outside. It is hence possible, for example, to compare the internal temperature with the external temperature. This is relevant, for instance, to assessing whether a temperature rise in the plug-in connector is caused by excessive currents and/or a fault or by a higher external temperature. The same also applies to humidity or light sensors.

Figure 2A:
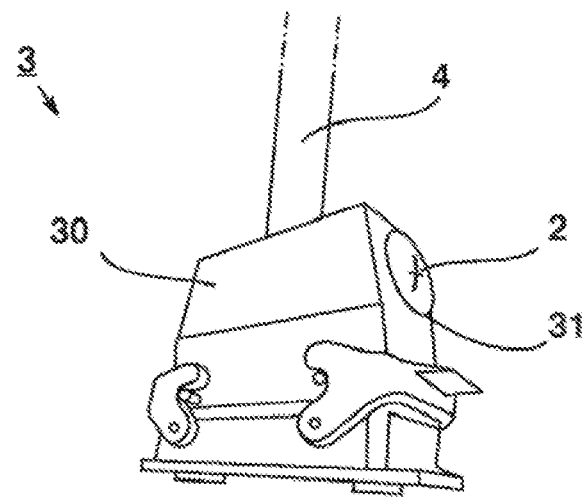
FIG. 2A shows a plug-in connector provided with a blanking plug from FIG. 1D.

FIG. 2A shows a plug-in connector 3 provided with a blanking plug 2 from FIG. 1D and having a housing 30 and a cable 4, which is fed through a cable feedthrough from above into the interior of the housing 30 of the plug-in connector 3. The plug-in connector 3 is connected to a connecting terminal provided for said plug-in connector. The plug-in connector 3 is a device 3 to be monitored by the measuring apparatus 1.

The housing 30 of the plug-in connector or of the device 3 to be monitored from FIG. 2A has to the side an additional, unused cable feedthrough 31, which is sealed by a blanking plug 2 from FIG. 1D, which is provided with a measuring apparatus 1. In this case, the sensor unit 12 protrudes, as shown in FIG. 1D, axially out of the cylindrical blanking plug 2 and extends into the interior of the housing 30. A sensor of the sensor unit 12 is thereby advantageously located inside the housing 30 of the plug-in connector 3.

Figure 2B:
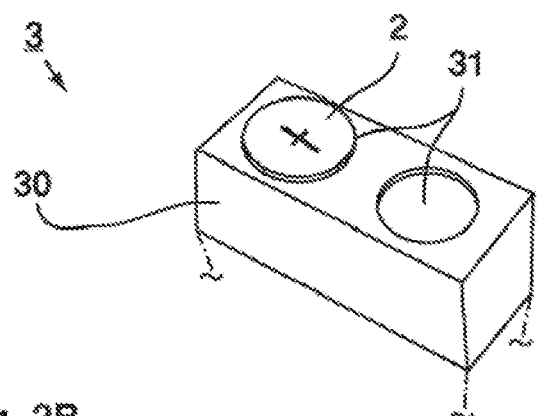
FIG. 2B shows part of a housing of another plug-in connector provided with a blanking plug from FIG. 1D.

FIG. 2B shows part of a housing 30 of a further plug-in connector 3, which is provided with a blanking plug from FIG. 1D, where the drawing shows for the sake of simplicity and clarity only an upper part of the housing 30, which part is of interest here and contains two cable feedthroughs 31. In this case, one of the two cable feedthroughs 31 is provided with a blanking plug 2, whereas the other cable feedthrough 31 is open.

Figure 2C:
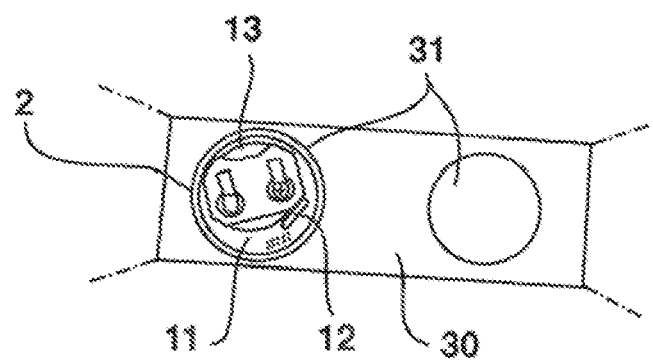
FIG. 2C shows the housing from FIG. 2B from the inside.

FIG. 2C shows the housing 30 from FIG. 2B from the inside. The measuring apparatus 1 comprising the control unit 11, the battery 13 and the sensor unit 12, which extends out of the blanking plug 2 and into the interior of the housing 30, is located in the blanking plug 2.

In order to space the sensor of the sensor unit 12 further from the control unit 11 and from the blanking plug 2, which is to be desired, an adapter cable (not shown in the drawings) can connect the connecting terminals 111 and 121. It is thereby possible to arrange a sensor located on the sensor unit 12 in a predetermined position of particular interest, in particular even in the vicinity of a connection inside the housing 30 of the plug-in connector 3, which connection is electrical in particular and is provided by a plug-in connector 3.

Figure 3A:
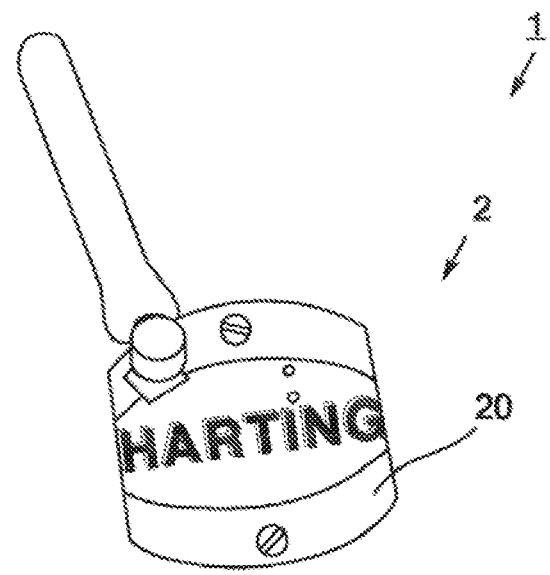
FIG. 3A shows a measuring apparatus according to another embodiment of the invention.
Figure 3B:
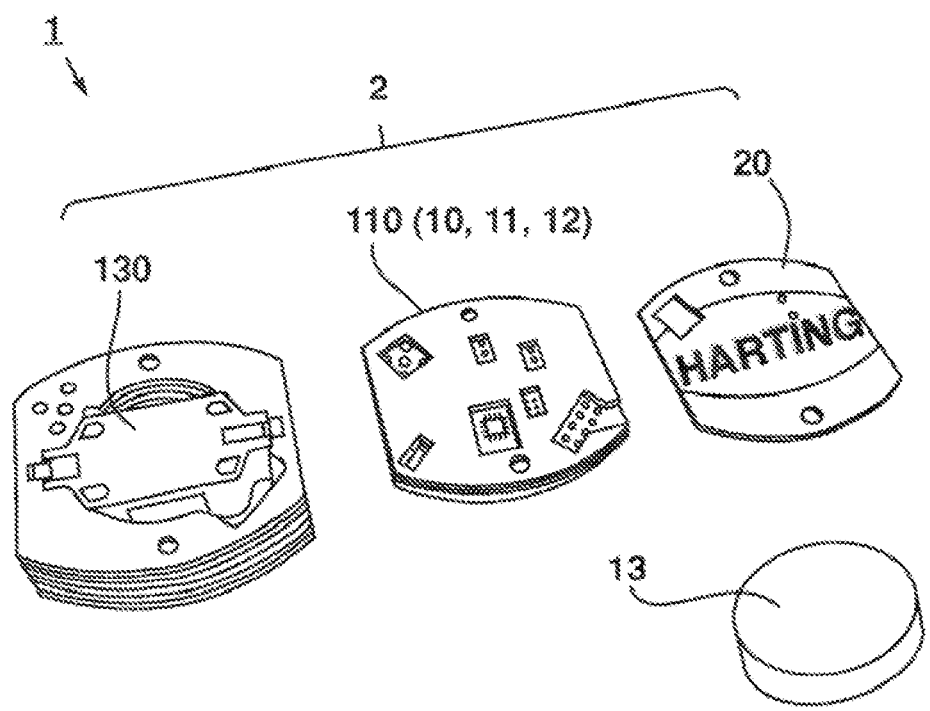
FIG. 3B shows the measuring apparatus from FIG. 3A disassembled into its essential constituent parts.

FIG. 3A shows a plan view of a hardware- and software-based measuring apparatus 1 having a housing 2 according to an embodiment of the invention, and FIG. 3B shows the measuring apparatus 1 from FIG. 3A disassembled into its essential constituent parts.

The electronics 10 of the measuring apparatus 1 are provided on a first printed circuit board 110, which is populated with electrical and electronic components of a control unit 11 and of a sensor unit 12, which are not shown in FIG. 3B on the first printed circuit board 110 for the sake of simplicity. The electronics 10 otherwise correspond to the measuring apparatus 1 described above with reference to FIGS. 1A and 1B.

The housing 2 has a top cover 20 containing a cutout for connecting an external antenna, and containing further cutouts for selected sensors to make contact with the environment of the housing 2. Provided in a bottom housing part is a battery holder 130 for a battery 13 as the means for supplying power to the electronics 10. The first printed circuit board 110 is sandwiched between the bottom housing part and the cover 20.

Like the blanking plug 2 described above, the housing 2 of the measuring apparatus from FIGS. 3A and 3B is made at least in part of a non-conducting material.

Two oppositely located through-holes for screw-fastening the measuring apparatus 1 in its intended position on a device to be monitored are provided on the lateral edge of the housing 2. The measuring apparatus 1 from FIGS. 3A and 3B is particularly suitable for monitoring the operating state of a machine.

Figure 4:
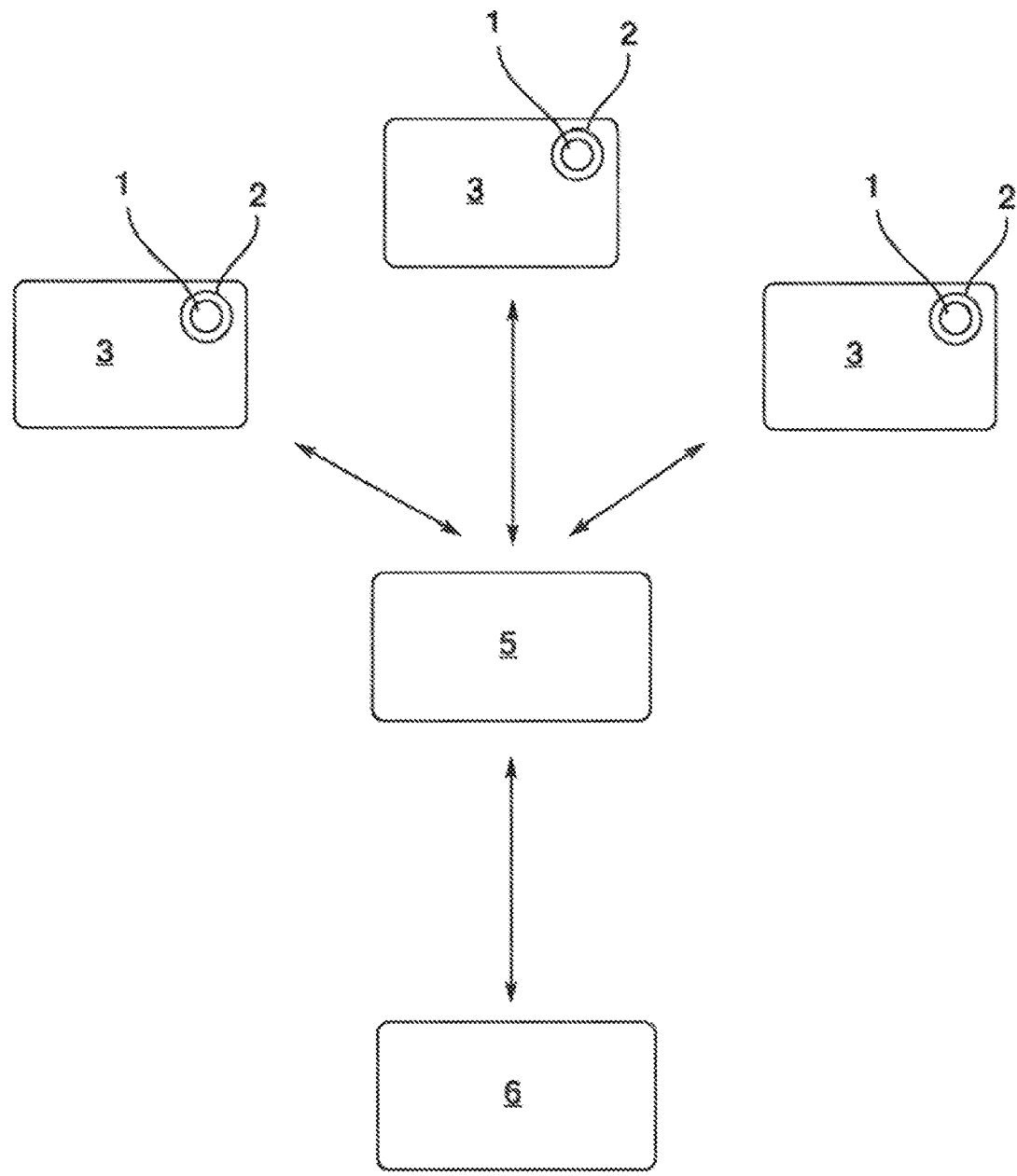
FIG. 4 shows a schematic diagram of the essential components of a system suitable for performing a method according to the invention.

FIG. 4 shows a schematic diagram of the essential components of a system according to an embodiment of the invention, which system is suitable for performing a method according to the invention.

The system from FIG. 4 comprises by way of example three measuring apparatuses 1 arranged on a device 3 to be monitored, which measuring apparatuses have a housing 2 arranged on the device 3. The measuring apparatus 1, the housing 2 and the device 3 are shown in FIG. 4 in a form that is highly schematic compared with the diagrams of FIGS. 1A, 1D and 2A. The measuring apparatuses 1 can have a similar design to the measuring apparatus 1 of FIGS. 1A and 1B, for example, and the devices 3 to be monitored can be, for example, plug-in connectors 3 to be monitored.

The system from FIG. 4 also advantageously comprises a first hardware- and software-based control and/or analysis apparatus 5, wherein the measuring apparatuses 1 and the first control and/or analysis apparatus 5 are configured for wireless bidirectional signal and/or data transfer.

The system from FIG. 4 also advantageously comprises a second hardware- and software-based control and/or analysis apparatus 6, wherein the first control and/or analysis apparatus 5 and the second control and/or analysis apparatus 6 are configured for bidirectional signal and/or data transfer.

A system according to FIG. 4 is particularly suitable for performing a method according to the invention as described in the introduction, wherein the first control and/or analysis apparatus 5 and the measuring apparatuses 1 are connected to one another for wireless signal and/or data communication, and the first control and/or analysis apparatus 5 is also connected to the second control and/or analysis apparatus 6 by wired and/or wireless means.

The second control and/or analysis apparatus 6 may here appropriately be, in particular, a host computer and/or a server, which is networked to the first control and/or analysis apparatus 5 via a local or global area network for signal and/or data transmission. According to a modification of the embodiment of the system from FIG. 4, the second control and/or analysis apparatus 6 may be a cellphone, as described above.

Although the figures each show combinations of different aspects or features of the invention, it is obvious to a person skilled in the art that, unless stated otherwise, the combinations presented and discussed are not the only possible combinations. In particular, mutually corresponding units or sets of features from different exemplary embodiments can be substituted for one another.

LIST OF REFERENCES 1 measuring apparatus
10 electronics
11 control unit
110 first printed circuit board
111 first connecting terminal
12 sensor unit
120 second printed circuit board
121 second connecting terminal
13 means for supplying power, battery
130 battery holder
2 housing, blanking plug
20 cover
3 device, plug-in connector
30 housing
31 cable feedthrough
4 cable
5 first control and/or analysis apparatus
6 second control and/or analysis apparatus

The invention claimed is:

1. A hardware- and software-based measuring apparatus for monitoring an operating state of the connections of a device, comprising:
at least one sensor for capturing measurement data relating to at least one physical parameter that characterizes the operating state of the device,
wherein the measuring apparatus comprises autonomous electronics having a control unit and a power supply, and
the control unit comprises a microcontroller that provides a radio interface for data and/or signal transmission to a control and/or analysis apparatus, and
the measuring apparatus comprises a housing that is fastened to a portion of an exterior face of the device in a retrofittable manner.

2. The measuring apparatus as claimed in claim 1, wherein the radio interface has a communications protocol having a power consumption of less than 1 watt (W), and a peak current consumption of less than 30 milliamperes (mA), and wherein the control unit comprises a chip antenna and/or is connected to an external antenna that extends outwards out of a blanking plug.

3. The measuring apparatus as claimed in claim 1, wherein the control unit has a bus interface and is fitted via the bus interface with a sensor unit comprising the sensor.

4. The measuring apparatus as claimed in claim 3, wherein the electronics of the control unit are provided on a first printed circuit board having a first connecting terminal, and
the electronics of the sensor unit are provided on a second printed circuit board having a second connecting terminal, wherein
the first connecting terminal corresponds to the second connecting terminal such that the control unit can be fitted with the sensor unit.

5. The measuring apparatus as claimed in claim 4, Wherein the sensor unit is spaced from the control unit by an adapter cable, and/or the first printed circuit board has a circular design, and/or the sensor unit does not protrude beyond the lateral edge of the first printed circuit board.

6. The measuring apparatus as claimed in claim 1, wherein the control unit comprises a battery holder, and the power supply is a battery having a capacity of at least 70 milliampere hours (mAh) and a rated voltage of 2.5 volts (V) to 4.5V.

7. The measuring apparatus as claimed in claim 1, wherein the control unit is designed and configured such that the measuring apparatus has an average power consumption of less than 100 microamperes (μA).

8. The measuring apparatus as claimed in claim 1, wherein the measuring apparatus comprises at least one actuator.

9. The measuring apparatus as claimed in claim 1, comprising a sensor for detecting the current carried via contacts of an electrical connection, and/or a sensor for detecting the prevailing temperature here and/or a humidity sensor and/or an accelerometer and/or a Hall sensor and/or a magnet sensor and/or a light sensor.

10. The measuring apparatus as claimed in claim 1, wherein the device is a plug-in connector, and
the housing is provided by a blanking plug intended for the plug-in connector, in which blanking plug at least part of the measuring apparatus is located, wherein the housing is provided at least in part from an electrically non-conducting material and/or is intended and accordingly designed for a cable feedthrough of a cable gland through a housing of the plug-in connector.

11. A hardware- and software-based method for monitoring the operating state of at least one device using at least one measuring apparatus comprising at least one sensor for capturing measurement data relating to at least one physical parameter that characterizes the operating state of the device, and comprising a control unit and a power supply, the control unit having a microcontroller that comprises a radio interface, and using at least one first hardware- and software-based control and/or analysis apparatus, which is wirelessly connected to the measuring apparatus for the purpose of signal and/or data transmission, wherein the measuring apparatus comprises a housing that is fastened to a portion of an exterior face of the device in a retrofittable manner,
comprising the steps:
the measuring apparatus captures measurement data relating to at least one physical parameter that characterizes the operating state of the device;
the measuring apparatus at least partially analyzes and/or transmits to a first control and/or analysis apparatus the measurement data captured by the measuring apparatus;
and/or
the first control and/or analysis apparatus retrieves the measurement data captured measuring apparatus;
and/or
the first control and/or analysis apparatus collects the measurement data captured by the measuring apparatus;
and/or
the first control and/or analysis apparatus analyzes at least partially the measurement data captured by the measuring apparatus.

12. The method as claimed in claim 11, wherein
the measuring apparatus analyzes the measurement data in such a way that a signal corresponding to an analysis result is made to an actuator of the control unit and/or a corresponding signal is made to the first control and/or analysis apparatus;
and/or
the first control and/or analysis apparatus analyzes the measurement data in such a way that a signal corresponding to the analysis result is made to the measuring apparatus.

13. The method as claimed in claim 11, wherein
the measuring apparatus has autonomous electronics comprising a battery as the power supply, and wherein the capture and/or collection and/or analysis and/or retrieval and/or transmission of the measurement data by the control unit of the measuring apparatus and/or by the first control and/or analysis apparatus is performed such that the measuring apparatus has an average power consumption of less than 100 μA.

14. The method as claimed in claim 12 using at least one second hardware- and software-based control and/or analysis apparatus, which is connected to the first control and/or analysis apparatus for signal and/or data transmission, comprising the steps:
the data collected and/or analyzed by the first control and/or analysis apparatus, and/or a signal corresponding to the analyzed data, is transmitted to the second control and/or analysis apparatus;
and/or
the data collected and/or analyzed by the first control and/or analysis apparatus is retrieved by the second control and/or analysis apparatus;
and/or
the data collected and/or analyzed by the first control and/or analysis apparatus, and/or a signal corresponding to the analyzed data, is collected and/or analyzed by the second control and/or analysis apparatus.

15. The method as claimed in claim 14, wherein
the second control and/or analysis apparatus analyzes the measurement data in such a way that a signal corresponding to an analysis result from the second control and/or analysis apparatus is made to the first control and/or analysis apparatus,
whereupon the first control and/or analysis apparatus analyzes the signal received from the second control and/or analysis apparatus in such a way that a signal corresponding to the analysis result from the first control and/or analysis apparatus is made to the measuring apparatus.

16. The hardware- and software-based method as claimed in claim 11 using the at least one measuring apparatus for monitoring the operating state of the connections of the device
comprising at least one sensor for capturing measurement data relating to at least one physical parameter that characterizes the operating state of the device,
wherein
the measuring apparatus comprises autonomous electronics having the control unit and the power supply, and
the microcontroller of the control unit provides the radio interface for data and/or signal transmission to the control and/or analysis apparatus.

17. A system for monitoring the operating state of at least one device, comprising
at least one measuring apparatus comprising at least one sensor for capturing measurement data relating to at least one physical parameter that characterizes the operating state of the device, and comprising a control unit having a microcontroller that comprises a radio interface, wherein the measuring apparatus comprises a housing that is fastened to a portion of an exterior face of the device in a retrofittable manner;

and comprising at least one first hardware- and software-based control and/or analysis apparatus, wherein the measuring apparatus and the first control and/or analysis apparatus are configured for wireless bidirectional signal and/or data transfer; and are configured to perform the following steps:

the measuring apparatus captures measurement data relating to at least one physical parameter that characterizes the operating state of the device;

the measuring apparatus at least partially analyzes and/or transmits to a first control and/or analysis apparatus the measurement data captured by the measuring apparatus;

and/or the first control and/or analysis apparatus retrieves the measurement data captured by the measuring apparatus;

and/or the first control and/or analysis apparatus collects the measurement data captured by the measuring apparatus;

and/or the first control and/or analysis apparatus analyzes at least partially the measurement data captured by the measuring apparatus.

18. The system as claimed in claim 17 comprising at least one second hardware- and software-based control and/or analysis apparatus, wherein the first control and/or analysis apparatus and the second control and/or analysis apparatus are configured for bidirectional signal and/or data transfer, wherein the second control and/or analysis apparatus is a host computer and/or a server and/or a cellphone, and wherein the data collected and/or analyzed by the first control and/or analysis apparatus, and/or a signal corresponding to the analyzed data, is transmitted to the second control and/or analysis apparatus;

and/or the data collected and/or analyzed by the first control and/or analysis apparatus is retrieved by the second control and/or analysis apparatus;

and/or the data collected and/or analyzed by the first control and/or analysis apparatus, and/or a signal corresponding to the analyzed data, is collected and/or analyzed by the second control and/or analysis apparatus.

19. The system as claimed in claim 17 comprising the at least one measuring apparatus for monitoring the operating state of the connections of the at least one device comprising the at least one sensor for capturing measurement data relating to at least one physical parameter that characterizes the operating state of the device, wherein the measuring apparatus comprises autonomous electronics having the control unit and the power supply, and the microcontroller of the control unit provides the radio interface for data and/or signal transmission to the control and/or analysis apparatus.

* * * * *